(12) United States Patent
Zimmerman et al.

(10) Patent No.: US 9,040,867 B2
(45) Date of Patent: May 26, 2015

(54) MANUFACTURING MACHINE WITH MAGNETIC FIELD BEAM STEERING

(71) Applicant: United Technologies Corporation, Hartford, CT (US)

(72) Inventors: Benjamin Joseph Zimmerman, Enfield, CT (US); Adam Z. Doherty, Boxborough, MA (US); Benjamin T. Fisk, East Granby, CT (US)

(73) Assignee: United Technologies Corporation, Hartford, CT (US)

( * ) Notice: Subject to any disclaimer, the term of this patent is extended or adjusted under 35 U.S.C. 154(b) by 329 days.

(21) Appl. No.: 13/724,380

(22) Filed: Dec. 21, 2012

(65) Prior Publication Data
US 2014/0175066 A1  Jun. 26, 2014

(51) Int. Cl.
*B23K 15/00* (2006.01)
*H01J 37/30* (2006.01)
*B23K 15/02* (2006.01)

(52) U.S. Cl.
CPC ............... *B23K 15/02* (2013.01); *B23K 15/00* (2013.01); *B23K 15/002* (2013.01); *H01J 37/30* (2013.01); *B23K 15/0086* (2013.01)

(58) Field of Classification Search
CPC .. B23K 15/00; B23K 15/002; B23K 15/0086; B23K 26/34; B23K 9/08; H02J 37/30; H02J 37/31; H02J 37/315; H02J 37/317

USPC ............ 219/121.28, 121.29, 121.78, 121.16, 219/121.17, 121.65, 121.66; 250/492.1, 250/492.3
See application file for complete search history.

(56) References Cited

U.S. PATENT DOCUMENTS

| | | | | |
|---|---|---|---|---|
| 3,360,398 | A | * 12/1967 | Garibotti | ................. 430/296 |
| 3,483,350 | A | 12/1969 | Pohl | |
| 4,334,156 | A | * 6/1982 | Bohlen et al. | ............. 250/491.1 |
| 4,672,615 | A | * 6/1987 | Kelly et al. | ................... 372/2 |
| 4,757,208 | A | * 7/1988 | McKenna et al. | .......... 250/492.2 |
| 4,777,369 | A | 10/1988 | Nakamura et al. | |
| 4,831,230 | A | 5/1989 | Lemelson | |
| 5,398,193 | A | * 3/1995 | deAngelis | ................... 700/119 |
| 6,515,291 | B2 | 2/2003 | Itoh | |
| 6,856,402 | B2 | 2/2005 | Hill | |
| 6,888,090 | B2 | * 5/2005 | Murphy | ................ 219/121.14 |
| 6,888,638 | B1 | 5/2005 | Hill | |
| 7,030,374 | B2 | 4/2006 | Franzen | |
| 7,454,262 | B2 | 11/2008 | Larsson | |
| 7,635,825 | B2 | 12/2009 | Larsson | |
| 7,833,465 | B2 | 11/2010 | Larsson | |

* cited by examiner

*Primary Examiner* — Samuel M Heinrich
(74) *Attorney, Agent, or Firm* — Carlson, Gaskey & Olds

(57) ABSTRACT

According to an example embodiment, a machine includes, among other things, a housing and a support situated for supporting a work piece in a selected position relative to the housing. A radiation source is situated for emitting a beam of radiation in the housing. A magnetic field generator is situated for generating a magnetic field in the housing near the support. The magnetic field has a selectively variable strength at a plurality of locations in the housing for selectively steering the beam of radiation toward the support.

19 Claims, 3 Drawing Sheets

MANUFACTURING MACHINE WITH MAGNETIC FIELD BEAM STEERING

BACKGROUND

A variety of manufacturing machines use a beam of radiation for performing a portion of a manufacturing process. For example, lasers or electron beams are used for achieving desired surface finishes. Other machines use lasers or electron beams for producing three-dimensional products by successively fusing together layers of powder. Such powder bed additive manufacturing machines are used for a variety of purposes.

One shortcoming of known surface finishing or powder bed additive machines is that it is difficult to apply the laser or electron beam over a large surface area. It is difficult to achieve a desired angle of incidence for the laser or electron beam across a larger surface area. Some proposals to address this situation include using multiple lasers or mounting a laser on a gantry so that it is moveable relative to the work surface. For machines that include electron beams, this is more difficult because they require a vacuum and there are practical limitations on how large a vacuum chamber can be made.

SUMMARY

According to an example embodiment, a machine includes, among other things, a housing and a support situated for supporting a work piece in a selected position relative to the housing. A radiation source is situated for emitting a beam of radiation in the housing. A magnetic field generator is situated for generating a magnetic field in the housing near the support. The magnetic field has a selectively variable strength at a plurality of locations in the housing for selectively steering the beam of radiation toward the support.

In a further non-limiting embodiment of the foregoing machine, the machine comprises a controller and wherein the magnetic field generator comprises a plurality of electromagnets, the controller selectively controlling the electromagnets for generating a selected magnetic field strength.

In a further non-limiting embodiment of either the foregoing machines, the controller is configured to control the electromagnets to vary a strength of the magnetic field over time at each of a plurality of locations in the housing.

In a further non-limiting embodiment of any of the foregoing machines, the controller is configured to control the electromagnets to generate a magnetic field that guides the beam of radiation in a predetermined pattern across a reference plane associated with the support.

In a further non-limiting embodiment of any of the foregoing machines, the predetermined pattern includes the beam being perpendicular to the reference plane at a location where the beam intersects the reference plane.

In a further non-limiting embodiment of any of the foregoing machines, the housing includes a first region in which the magnetic field generator generates a first portion of the magnetic field. The housing includes a second region in which the magnetic field generator generates a second portion of the magnetic field. The first portion of the magnetic field has a consistent strength throughout the first region and the second portion of the magnetic field has a plurality of strengths at a corresponding plurality of locations within the second region.

In a further non-limiting embodiment of any of the foregoing machines, there is a three-dimensional space above the support within the housing between the support and a top of the housing. The three dimensional space corresponds to a size of the support. The radiation source is located outside of the three-dimensional space and the beam of radiation passes through the three-dimensional space.

In a further non-limiting embodiment of any of the foregoing machines, the support is situated at a first vertical position relative to the housing and at least a portion of the radiation source is located at a second vertical position relative to the housing, the second vertical position being beneath the first vertical position.

In a further non-limiting embodiment of any of the foregoing machines, the radiation beam follows a path between the radiation source and a reference plane associated with the support. The path includes a first portion along a first direction, a second portion along a second direction that is transverse to the first direction and a third portion along a third direction that is opposite to and generally parallel with the first direction.

In a further non-limiting embodiment of any of the foregoing machines, the radiation source generates an electron beam.

According to an example embodiment, a method of operating a machine that includes a support situated for supporting a work piece in a selected position relative to a housing includes, among other things, emitting a beam of radiation in the housing. A magnetic field is generated in the housing near the support. A strength of the magnetic field is selectively varied at a plurality of locations in the housing for selectively steering the beam of radiation toward the support.

In a further non-limiting embodiment of the foregoing method, the machine includes a plurality of electromagnets and the method comprises selectively controlling the electromagnets for generating a selected magnetic field strength.

In a further non-limiting embodiment of either of the foregoing methods, the method comprises varying a strength of the magnetic field over time at each of a plurality of locations in the housing.

In a further non-limiting embodiment of any of the foregoing methods, the method comprises generating a magnetic field that guides the beam of radiation in a predetermined pattern across a reference plane associated with the support.

In a further non-limiting embodiment of any of the foregoing methods, the predetermined pattern includes the beam being perpendicular to the reference plane at a location where the beam intersects the reference plane.

In a further non-limiting embodiment of any of the foregoing methods, the method comprises generating a first portion of the magnetic field in a first region within the housing and generating a second portion of the magnetic field in a second region within the housing. The first portion of the magnetic field has a consistent strength throughout the first region and the second portion of the magnetic field has a plurality of strengths at a corresponding plurality of locations within the second region.

In a further non-limiting embodiment of any of the foregoing methods, there is a three-dimensional space above the support within the housing between the support and a top of the housing. The method comprises generating the beam of radiation at a location outside of the three dimensional space and steering the beam into and within the three-dimensional space.

In a further non-limiting embodiment of any of the foregoing methods, the method comprises steering the radiation beam along a path toward a reference plane associated with the support. The path includes a first portion along a first direction, a second portion along a second direction that is transverse to the first direction and a third portion along a third direction that is opposite to and generally parallel with the first direction.

In a further non-limiting embodiment of any of the foregoing methods, the beam of radiation comprises an electron beam.

The various features and advantages of at least one disclosed embodiment will become apparent to those skilled in the art from the following detailed description. The drawings that accompany the detailed description can be briefly described as follows.

DETAILED DESCRIPTION

Figure 1:
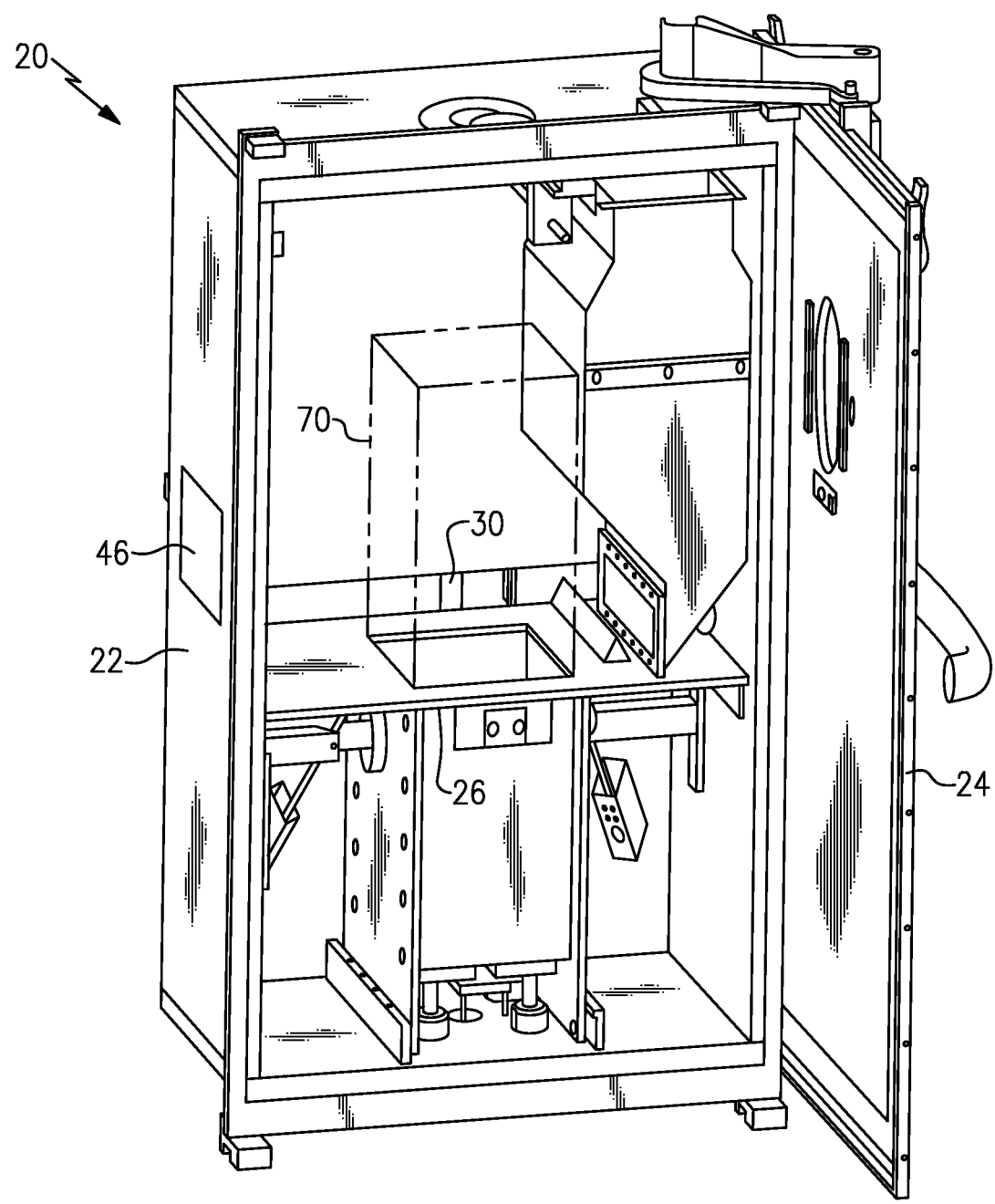
FIG. 1 diagrammatically illustrates a machine designed according to an embodiment of this invention.

FIG. 1 illustrates a machine 20 that includes a housing 22. In this example, the housing 22 comprises a cabinet having a door 24 illustrated in an open position. In one example, the machine 20 is useful for a known surface finishing process. In another example the machine is useful as a powder bed additive manufacturing machine, which forms three-dimensional objects by fusing layers of powder in a known manner.

The example machine 20 includes a support 26 situated for supporting a work piece in a selected position relative to the housing 22. In the illustrated example the support 26 is situated within the housing 22. In some examples, at least a portion of the support 26 may be outside of the housing 22.

Figure 2:
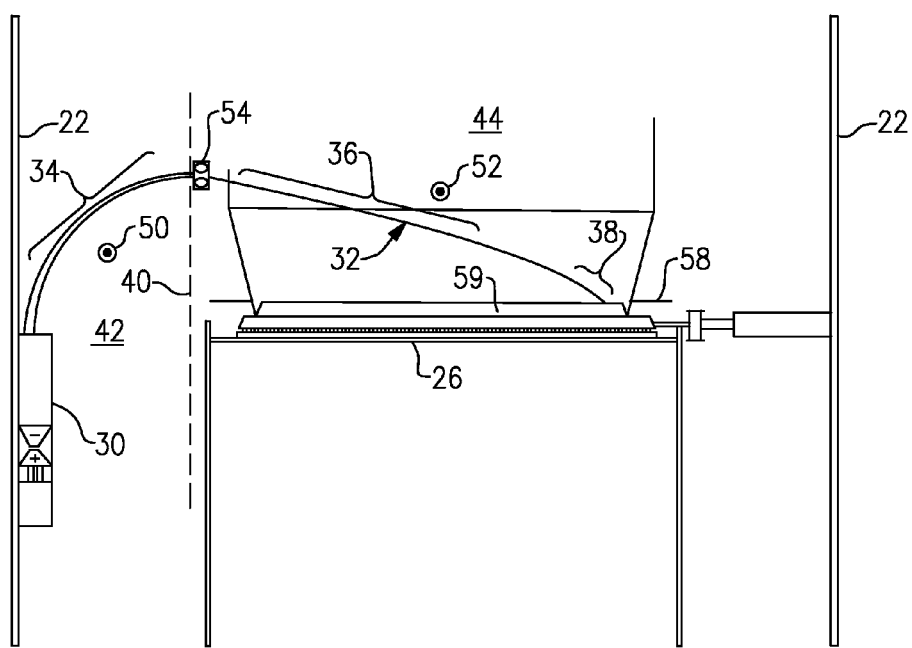
FIG. 2 schematically illustrates selected features of the example from FIG. 1.
Figure 3:
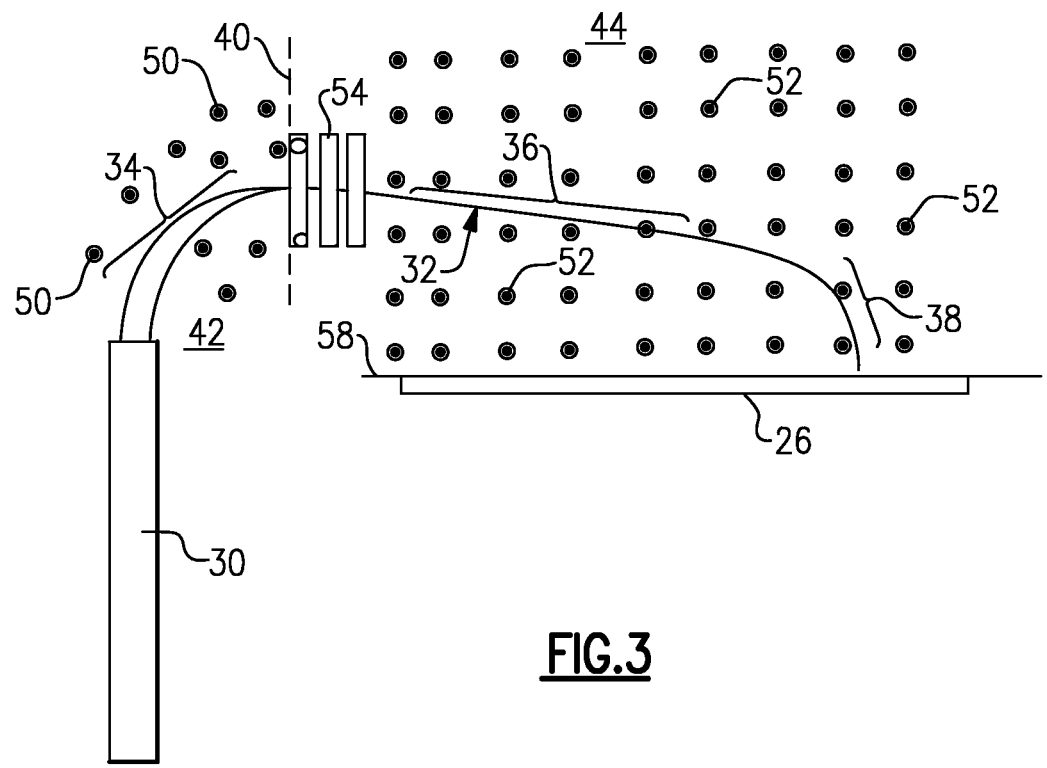
FIG. 3 schematically illustrates interaction between a magnetic field and a beam of radiation according to an example embodiment.

A radiation source 30 is situated for emitting a beam of radiation in the housing 22. FIGS. 2 and 3 show an example arrangement of the radiation source 30. In this example, the radiation source 30 comprises an electron beam gun that generates an electron beam 32 in a known manner. In this example, the electron beam 32 includes a first portion 34, a second portion 36 and a third portion 38.

A reference line 40 schematically divides a portion of the housing 22 into a first region 42 and a second region 44. A magnetic field generator 46 (FIGS. 1 and 4) generates a magnetic field in the housing 22 near the support 26. In this example, a first portion 50 of the magnetic field is schematically shown within the first region 42. The first portion 50 of the magnetic field in this example has a uniform strength within the first region 42. A second portion 52 of the magnetic field is schematically shown within the second region 44. The second portion 52 has a selectively variable strength. In this example, the second portion 52 of the magnetic field has different strengths at different locations within the second region 44. The strength of the magnetic field at any given location affects the direction or orientation of the electron beam 32. Selectively varying the strength of the magnetic field among different locations within the housing 22 allows for steering the electron beam 32 within the housing 22 to achieve a desired result of a process such as a manufacturing or finishing process. The strength of the magnetic field may vary over time at various locations within the housing. Strategically controlling the magnetic field allows for causing the electron beam 32 to move along a desired trajectory to complete a manufacturing process.

In the illustrated example, the first portion 34 of the electron beam 32 travels in a first direction through the first region 42. In the examples of FIGS. 2 and 3, the first direction is generally upward (according to the drawings). A focus coil 54 focuses the electron beam 32 in a known manner as the electron beam 32 begins to travel within the second region 44. The second portion 36 of the electron beam 32 follows a path along a second direction that is transverse to the direction of the first portion 34. In the case of FIGS. 2 and 3, the second portion 36 of the electron beam 32 moves generally horizontally (according to the drawing). The third portion 38 of the electron beam 32 moves in a third direction that is oriented generally parallel to the direction of the first portion 34 but in an opposite direction (e.g., downward according to the drawing). The variable strength of the second portion 52 of the magnetic field establishes the path that the electron beam 32 follows within the second region 44.

One feature of the illustrated example is that it allows for the electron beam 32 to be incident on a reference plane 58 associated with the support 26 at a desired angle of incidence. In many situations it is desired to have the electron beam 32 oriented generally perpendicular to the reference plane 58 to achieve a desired effect on a surface of a work piece 59, that is coincident with the reference plane 58. The angle at which the electron beam 32 contacts the surface of the work piece 59 has an impact on the accuracy of the procedure being performed, for example. The variable strength of the second portion 52 of the magnetic field allows for steering the electron beam 32 to achieve an appropriate orientation of the third portion 38 of the electron beam 32 and a desired angle of incidence where the beam 32 contacts the work piece 59. For example, some processes require an accuracy or tolerance on a surface on the order of 50 microns. That level of accuracy requires proper beam orientation during contact with the surface.

Another feature of the illustrated example is that the source of radiation 30 can be positioned in a variety of locations relative to the support 26. In the example of FIGS. 2 and 3, the source of radiation 30 is situated to the side of the support 26 and at least partially beneath the reference plane 58. Positioning the source of radiation 30 in this manner allows for making a smaller housing 22 compared to arrangements that required a laser or electron beam source to be situated directly above the support 26. This feature of the illustrated example allows for more versatility in machine design and configuration.

Another feature of the illustrated example is that the source of radiation 30 is situated out of the path of any hot gases or metal vapors that rise from the work piece 56 during a surface finishing or manufacturing process. This allows for a wider selection of sources of radiation 30 and introduces additional potential cost savings. FIG. 1 schematically shows a three dimensional area 70 situated above the support 26 within the housing 22. The area 70 represents an area where hot gases or metal vapors may tend to rise during a surface finishing or manufacturing process. The source of radiation 30 is situated outside of the three dimensional area 70 and is therefore effectively protected from any negative effects that would otherwise be associated with exposure to the metal vapors or hot gases.

Figure 4:
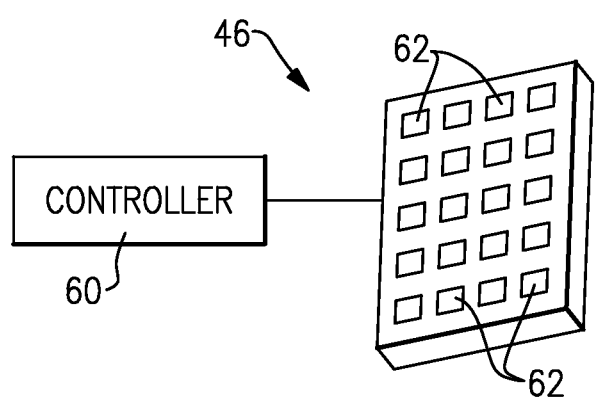
FIG. 4 schematically illustrates an example magnetic field generator.

FIG. 4 schematically illustrates an example arrangement of a magnetic field generator 46. A controller 60 is suitably programmed for controlling a plurality of electromagnets 62. Controlling each electromagnet 62 allows for controlling the strength of the magnetic field within the housing. For example, some of the electromagnets 62 are situated for generating the first portion 50 of the magnetic field. Each of those electromagnets 62 are controlled in a similar manner for generating a magnetic field having a uniform strength within the region 42. Others of the electromagnets 62 are controlled for providing the different magnetic field strength of the second portion 52 of the magnetic field at different locations within the second region 44. The controller 60 may be realized using a variety of computing devices. The controller 60 may include a processor, memory and one or more input or output device interfaces to allow an individual to program the controller 60 for completing a desired manufacturing process using the machine 20.

The controller 60 may be a hardware device for executing software, particularly software stored in memory. The processor can be a custom made or commercially available processor, a central processing unit, an auxiliary processor among several processors associated with a computing device, a semi-conductor based microprocessor (in the form of a microchip or chip set) or generally any device for executing software instructions.

When the controller 60 is in operation, the processor can be configured to execute software stored within memory, to communicate data to and from the memory, and to generally control operations of the computing device pursuant to the software. Software and memory, in whole or in part, is read by the processor, perhaps buffered within the processor and then executed. Given this description, those skilled in the art will realize what form of controller 60 will meet the needs of their particular situation.

The disclosed example arrangement provides an ability to achieve desired interaction between a beam of radiation, such as an electron beam, and a work piece within a machine. The illustrated example provides such a result while reducing the space required for the machine and allowing for more versatility in the arrangement of the components within the machine. The disclosed example arrangement provides enhanced manufacturing economies along with the ability to achieve better interaction between a beam of radiation and a work piece.

The foregoing description shall be interpreted as illustrative and not in any limiting sense. A worker of ordinary skill in the art would understand that certain modifications could come within the scope of this disclosure. For these reasons, the following claims should be studied.

We claim:

1. A machine, comprising:
a housing;
a support situated for supporting a work piece in a selected position relative to the housing;
a radiation source situated for emitting a beam of radiation in the housing; and
a magnetic field generator situated for generating a magnetic field in the housing near the support, the magnetic field having a selectively variable strength at a plurality of locations in the housing for selectively steering the beam of radiation toward the support.

2. The machine of claim 1, comprising a controller and wherein the magnetic field generator comprises a plurality of electromagnets, the controller selectively controlling the electromagnets for generating a selected magnetic field strength.

3. The machine of claim 2, wherein the controller is configured to control the electromagnets to vary a strength of the magnetic field over time at each of a plurality of locations in the housing.

4. The machine of claim 3, wherein the controller is configured to control the electromagnets to generate a magnetic field that guides the beam of radiation in a predetermined pattern across a reference plane associated with the support.

5. The machine of claim 4, wherein the predetermined pattern includes the beam being perpendicular to the reference plane at a location where the beam intersects the reference plane.

6. The machine of claim 1, wherein
the housing includes a first region in which the magnetic field generator generates a first portion of the magnetic field;
the housing includes a second region in which the magnetic field generator generates a second portion of the magnetic field;
the first portion of the magnetic field has a consistent strength throughout the first region; and
the second portion of the magnetic field has a plurality of strengths at a corresponding plurality of locations within the second region.

7. The machine of claim 1, wherein
there is a three-dimensional space above the support within the housing between the support and a top of the housing;
the three dimensional space corresponds to a size of the support;
the radiation source is located outside of the three-dimensional space; and
the beam of radiation passes through the three-dimensional space.

8. The machine of claim 7, wherein
the support is situated at a first vertical position relative to the housing; and
at least a portion of the radiation source is located at a second vertical position relative to the housing, the second vertical position being beneath the first vertical position.

9. The machine of claim 1, wherein
the radiation beam follows a path between the radiation source and a reference plane associated with the support; and
the path includes
a first portion along a first direction,
a second portion along a second direction that is transverse to the first direction and
a third portion along a third direction that is opposite to and generally parallel with the first direction.

10. The machine of claim 1, wherein the radiation source generates an electron beam.

11. A method of operating a machine that includes a support situated for supporting a work piece in selected position relative to a housing, comprising the steps of:
emitting a beam of radiation in the housing;
generating a magnetic field in the housing near the support;
selectively varying a strength of the magnetic field at a plurality of locations in the housing for selectively steering the beam of radiation toward the support.

12. The method of claim 11, wherein the machine includes a plurality of electromagnets and the method comprises
selectively controlling the electromagnets for generating a selected magnetic field strength.

13. The method of claim 11, comprising varying a strength of the magnetic field over time at each of a plurality of locations in the housing.

14. The method of claim 13, comprising generating a magnetic field that guides the beam of radiation in a predetermined pattern across a reference plane associated with the support.

15. The method of claim 14, wherein the predetermined pattern includes the beam being perpendicular to the reference plane at a location where the beam intersects the reference plane.

16. The method of claim 11, comprising
generating a first portion of the magnetic field in a first region within the housing; and
generating a second portion of the magnetic field in a second region within the housing;
wherein
the first portion of the magnetic field has a consistent strength throughout the first region; and
the second portion of the magnetic field has a plurality of strengths at a corresponding plurality of locations within the second region.

17. The method of claim 1, wherein there is a three-dimensional space above the support within the housing between the support and a top of the housing and the method comprises
generating the beam of radiation at a location outside of the three dimensional space; and
steering the beam into and within the three-dimensional space.

18. The method of claim 11, comprising
steering the radiation beam along a path toward a reference plane associated with the support,
wherein the path includes
a first portion along a first direction,
a second portion along a second direction that is transverse to the first direction and
a third portion along a third direction that is opposite to and generally parallel with the first direction.

19. The method of claim 11, wherein the beam of radiation comprises an electron beam.

* * * * *